(12) United States Patent
Wang et al.

(10) Patent No.: US 9,537,017 B2
(45) Date of Patent: Jan. 3, 2017

(54) PROCESS FOR FORMING A PLANAR DIODE USING ONE MASK

(71) Applicant: Vishay General Semiconductor LLC, Hauppauge, NY (US)

(72) Inventors: Benson Wang, Taipei (TW); Kevin Lu, Taipei (TW); Warren Chiang, Taipei (TW); Max Chen, Taipei (TW)

(73) Assignee: VISHAY GENERAL SEMICONDUCTOR LLC, Hauppauge, NY (US)

( * ) Notice: Subject to any disclaimer, the term of this patent is extended or adjusted under 35 U.S.C. 154(b) by 0 days.

(21) Appl. No.: 14/608,742

(22) Filed: Jan. 29, 2015

(65) Prior Publication Data

US 2015/0179824 A1    Jun. 25, 2015

Related U.S. Application Data

(62) Division of application No. 13/957,613, filed on Aug. 2, 2013, now Pat. No. 8,975,719, which is a division of application No. 11/090,708, filed on Mar. 25, 2005, now Pat. No. 8,525,222.

(51) Int. Cl.

| *H01L 29/861* | (2006.01) |
|---|---|
| *H01L 29/66* | (2006.01) |
| *H01L 21/22* | (2006.01) |
| *H01L 23/31* | (2006.01) |
| *H01L 29/167* | (2006.01) |

(52) U.S. Cl.
CPC .......... *H01L 29/8611* (2013.01); *H01L 21/22* (2013.01); *H01L 23/3171* (2013.01); *H01L 29/167* (2013.01); *H01L 29/66128* (2013.01); *H01L 2924/0002* (2013.01)

(58) Field of Classification Search
CPC   H01L 29/8611; H01L 29/66128; H01L 21/22; H01L 23/3171; H01L 29/167
See application file for complete search history.

(56) References Cited

U.S. PATENT DOCUMENTS

| 6,781,161 | B1 | 8/2004 | Turner, Jr. et al. | |
|---|---|---|---|---|
| 2001/0035560 | A1* | 11/2001 | Fujihira | H01L 29/0692 257/475 |
| 2003/0030120 | A1 | 2/2003 | Fujihira et al. | |
| 2005/0007721 | A1* | 1/2005 | Akkipeddi | G01L 1/2293 361/179 |
| 2005/0275065 | A1 | 12/2005 | Cogan et al. | |

FOREIGN PATENT DOCUMENTS

| JP | 52-150981 | 12/1977 |
|---|---|---|
| JP | 07-050309 | 2/1995 |
| JP | 2001-230245 | 8/2001 |
| JP | 2002-261041 | 9/2002 |
| JP | 2005079462 | 3/2005 |

* cited by examiner

*Primary Examiner* — Long Pham
(74) *Attorney, Agent, or Firm* — Karin L. Williams; Mayer & Williams PC

(57) ABSTRACT

A planar diode and method of making the same employing only one mask. The diode is formed by coating a substrate with an oxide, removing a central portion of the oxide to define a window through which dopants are diffused. The substrate is given a Ni/Au plating to provide ohmic contact surfaces, and the oxide on the periphery of the window is coated with a polyimide passivating agent overlying the P/N junction.

4 Claims, 4 Drawing Sheets

- (1) Wafer Start
- (2) P/N Diffusion

- (3) 1st Photo (for Grid Etching)

- (4) Grid Etching

- (5) Poly Nitride
- (6) 2nd Photo (Glass Photo)

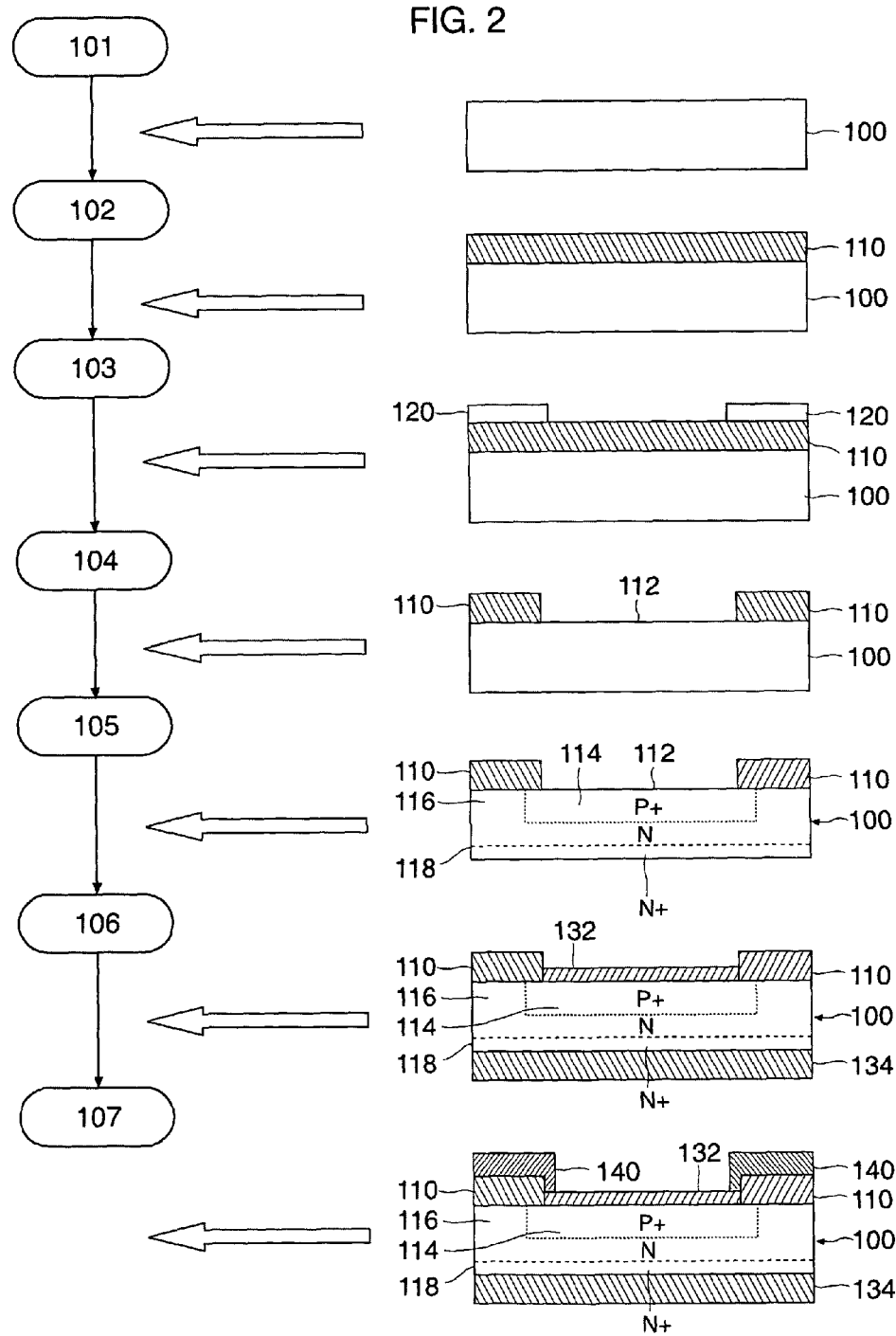

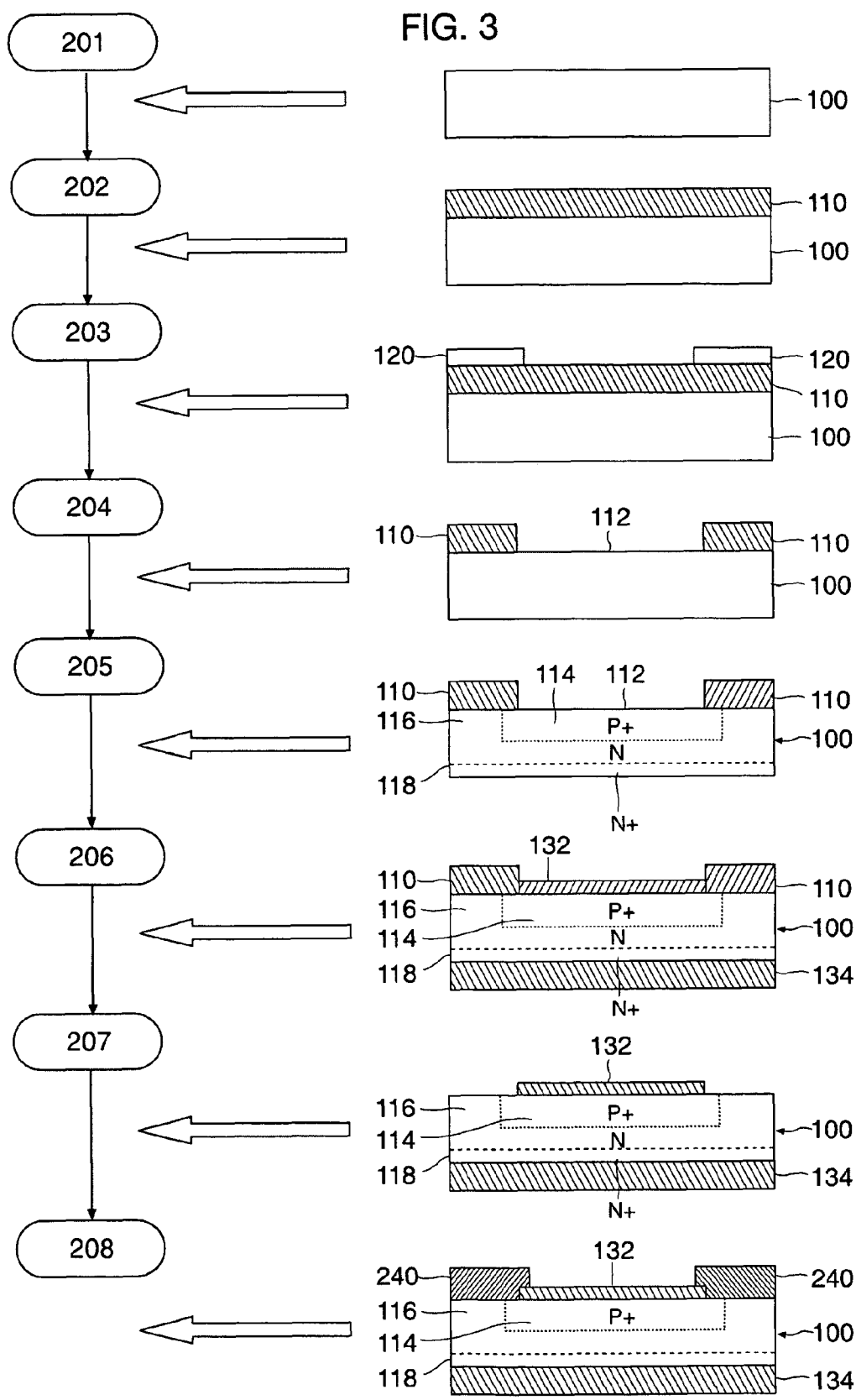

PROCESS FOR FORMING A PLANAR DIODE USING ONE MASK

STATEMENT OF RELATED APPLICATION

This application is a divisional of U.S. patent application Ser. No. 13/957,613, filed Aug. 2, 2013 entitled "PROCESS FOR FORMING A PLANAR DIODE USING ONE MASK", which is a divisional of U.S. patent application Ser. No. 11/090,708, filed Mar. 25, 2005, now U.S. Pat. No. 8,525,222, issued Sep. 3, 2013, entitled "PROCESS FOR FORMING A PLANAR DIODE USING ONE MASK". Both of these applications are incorporated herein by reference in their entireties.

BACKGROUND OF THE INVENTION

The present invention relates to a wafer-level process for fabricating semiconductor planar devices such as diodes and, more particularly, concerns a simplified wafer level process for fabricating planar diodes from semiconductor.

Diodes are mass produced in great numbers every year. As a high volume component found in virtually every electrical device of any complexity, the market for diodes is very large, competitive, and sensitive to pricing pressure. Manufacturers must produce these devices both with sufficient reliability and low cost to satisfy the competitive demands of the marketplace. Currently, one known process for manufacturing diodes from semiconductor chips entails the use of several photolithographic steps employing a mask, each of which increases the cost of manufacture.

A specific example of one such known process is a standard glass passivated pallet process employing three masking steps, and is illustrated in the process flow diagram of FIG. 1. Beginning in step 1 with a wafer of silicon 10, the wafer is doped in step 2 so as to provide P+, N, and N+ regions (respectively indicated as 12, 14, and 16 in FIG. 1). Prior to the first photolithographic step 3, a protective oxide layer is provided in the form of an oxide coating 18. After baking, developing, and hard baking, a first mask is used to generate the structure shown in the figure after step 3, in which windows 19 are opened up in the oxide layer 18. In step 4 these windows are etched to form grids in the silicon wafer, defining the intended boundaries of each diode.

In step 5, a layer 20 of polynitride is deposited to prepare the surface for step 6, the second photolithographic step in which a mask is employed. Here, a layer of glass powder 22 is deposited along the grid as indicated, baked under high pressure and fired (step 7).

In step 8, a low temperature oxide chemical vapor deposition process is used to overlay an oxide (silicon dioxide) on the surface to protect the glass for step 9, the third photolithographic step in which a mask is employed (here to deposit a polymer coating).

Contact etching and photoresist etching is performed in step 10, exposing the P+ and N+ surfaces, which are then coated with nickel plating in step 11 to provide ohmic contacts.

This known process requires three photolithographic steps in which a precision mask is employed. The repeated use of masks and the care with which they must be used is a substantial component in the cost of the finished product produced by this process.

Demand persists for diodes that can be manufactured using simpler and cheaper processes

SUMMARY OF THE INVENTION

The present invention includes embodiments that provide a planar diode and methods for its manufacture. The device comprises: (a) a substrate of a first conductivity type (preferably an N-type conductivity silicon substrate) and a doped, centrally located region of a second conductivity type (preferably a P+-type region) defining a P/N junction therebetween; (b) a nickel plating on the underside of the substrate and along the doped region of the substrate which corresponds to the second conductivity type; (c) an oxide coating on the peripheral portion of the top side of the substrate adjacent the doped central portion; and (d) a coating of a passivating material such as polyimide on top of the oxide on the top side of the substrate, the passivating material extending partially over the P/N junction. Boron may be employed as a dopant in this invention.

According to another embodiment of the invention, a method of forming a planar diode is provided. The method comprises: (a) providing a substrate of a first conductivity type; (b) depositing a layer of oxide over the substrate; (c) using a mask to expose the central portion of the oxide layer for etching; (d) removing the central portion of the oxide via etching; (e) forming a P/N junction in the substrate via window diffusion; (f) plating nickel onto the window and on the opposite side of the substrate; and (g) coating the remaining oxide and a portion of the plating on a side of the substrate with a passivating agent, such as a polyimide

BRIEF DESCRIPTION OF THE DRAWINGS

The present invention will become more readily apparent from the following detailed description taken in conjunction with the accompanying drawings in which:

FIG. 2 is a schematic view of a first embodiment of a process for the manufacture of diodes according to the principles of the invention.

FIG. 3 is a schematic view of a second embodiment of a process for the manufacture of diodes according to the principles of the invention.

DETAILED DESCRIPTION OF THE INVENTION

Figure 1:
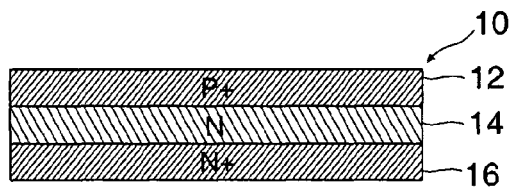
FIG. 1 is a schematic view of a known process for manufacturing planar diodes.
Figure 1:
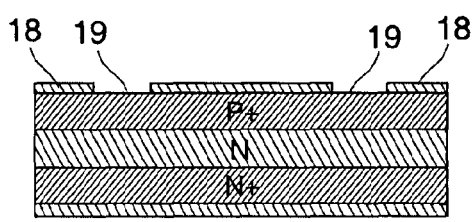
Figure 1:
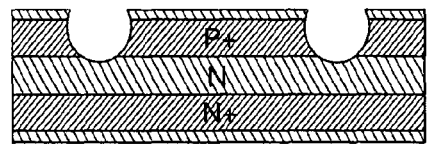
Figure 1:
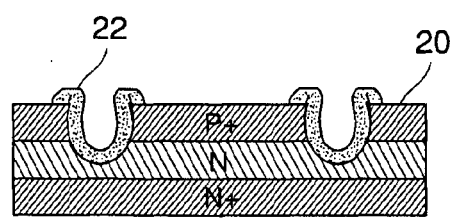
Figure 1:
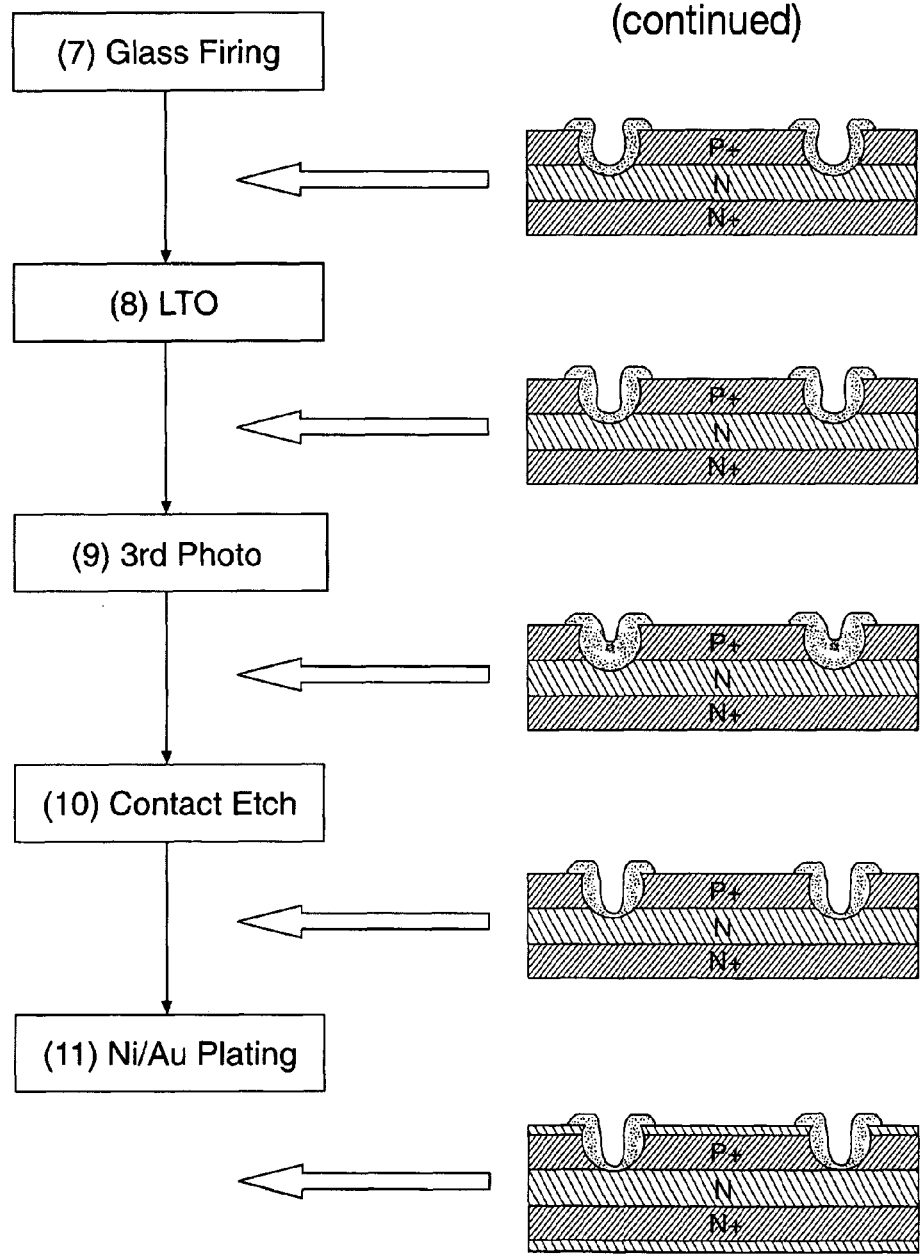

The present invention is directed both to a process for manufacturing planar diodes and the diodes so manufactured. One advantage associated with the present invention is that it requires the use of only one mask in contrast to other approaches which require more, thereby resulting in a more economical and reliable process for manufacturing planar diodes. Not only does the use of a single mask simplify the process, but it requires less equipment as well, as only a single conventional photolithographic aligner is required by this process. According to one aspect of the invention, a coating is provided of passivating material such as polyimide in order to enhance the resistance of the device to mechanical and environment stresses and moisture. This results in a more economical and reliable process for manufacturing planar diodes.

FIG. 2 illustrates a process for such manufacture in accordance with an embodiment of the present invention. The process begins at step 101 with a wafer 100, typically made of silicone (although the process can be employed with other semiconductive materials).

In step 102, the upper surface is oxidized in a known manner to provide an oxide layer 110 of silicon dioxide. (The lower surface may optionally be oxidized as well.)

Next, in step 103, a photoresist 120 is developed for contact etching. This is the only step in the process in which a mask is employed.

In step 104, contact etching exposes a window 112 in the oxide layer. Through this layer, a P/N junction is formed in step 105 via window diffusion, thus creating P+, N, and N+ type regions 114, 116, and 118 respectively, as is known in the art. Alternatively, different impurities can be employed to create a N/P junction comprising N+, P, and P+ type regions.

Ohmic contacts 132 and 134 are provided in step 106 via nickel plating, as is known in the art. The oxide 110 acts as a mask for the deposition of the metal contact 132 and is self-aligned to the P/N junction without need of an additional mask for metallization along the window 112.

By the end of step 106, a functional diode has been produced. However, in order to passivate the surface and thus provide a more reliable and durable device, a polyimide coating 140 is added in step 107 via the screen printing method (which is less expensive than the use of a mask). The polyimide coating serves to protect the device, and in particular, the P/N junction, against contamination and moisture. Optionally, and to further protect the nickel surface against corrosion, a gold plating may be applied to the exposed nickel surfaces.

By reducing the number of masks that are employed to one, the resulting planar diodes are cheaper to manufacture.

According to one example, the dimensions of the diode may be as follows:

| Layer | Thickness (approx., and in microns) |
| --- | --- |
| Oxide | 2.0 |
| photoresist | 5.0 |
| P+ | 50.0 |
| N+ | 100.0 |
| Polyimide | 10.0 |
| Nickel/Gold | 2.0 |

FIG. 3 illustrates an alternative embodiment of the invention, in which steps 201-206 are identical to steps 101-106, both in process and in resulting intermediate structures. This process begins at 201 with a wafer. In step 202, the upper surface is oxidized in a known manner to provide an oxidized layer. In step 203, a photoresist 120 is developed for contact etching. This is the only step in the process in which a mask is employed. In step 204, contact etching exposes a window in the oxide layer. Through this layer, a P/N junction is formed in step 205 via window diffusion, thus creating P+, N, and N+ type regions. Ohmic contacts are provided in step 206 via nickel plating.

The process diverges from that shown in FIG. 2 in step 207, in which the remaining oxide layer 110 is stripped off. Removing the layer of oxide at this point has the advantage of enabling the removal of contaminants that my have infiltrated between the oxide and the silicon, thereby providing a cleaner P/N junction. Then, in step 208, a passivating layer of polyimide 240 is applied directly to the exposed silicon, overlapping some with the upper contact 132.

Although various embodiments are specifically illustrated and described herein, it will be appreciated that modifications and variations of the present invention are covered by the above teachings and are within the purview of the appended claims without departing from the spirit and intended scope of the invention. For example, this approach could be applied to the manufacture of different kinds of semiconductor devices such as transient voltage suppressors, thyristors, and transistors.

What is claimed is:

1. A diode comprising:
    (a) a substrate of a first conductivity type and a doped region of a second conductivity type defining a P/N junction therebetween;
    (b) nickel plating on the underside of the substrate and along a central portion of a top side of the substrate overlying the doped region of the second conductivity type;
    (c) an oxide coating on the peripheral portion of the top side of the substrate adjacent the central portion; and
    (d) a coating of a passivating material along the oxide on the top side of the substrate, the passivating material extending partially over the P/N junction,
        wherein the nickel plating does not overlap with the oxide coating on the peripheral portion of the top side of the substrate.

2. The diode of claim 1, wherein said first conductivity type has N-type conductivity and said second conductivity type has P-type conductivity.

3. The diode of claim 1, wherein said doped region is doped with boron.

4. The diode of claim 1, wherein the passivating material is polyimide.

* * * * *